United States Patent [19]

Ang et al.

[11] Patent Number: 5,228,106

[45] Date of Patent: Jul. 13, 1993

[54] TRACK-AND-REGENERATE AMPLIFIERS AND MEMORIES USING SUCH AMPLIFIERS

[75] Inventors: Michael A. Ang, Santa Clara; David J. Pilling, Los Altos Hills, both of Calif.

[73] Assignee: Integrated Device Technology, Inc., Santa Clara, Calif.

[21] Appl. No.: 709,923

[22] Filed: May 30, 1991

[51] Int. Cl.⁵ .............................................. G11C 11/40
[52] U.S. Cl. .................................. 365/208; 365/203; 365/205
[58] Field of Search ............... 365/202, 203, 205, 207, 365/208; 307/530

[56] References Cited

U.S. PATENT DOCUMENTS

| | | | |
|---|---|---|---|
| 4,694,427 | 9/1987 | Miyamoto et al. | 365/205 |
| 4,975,879 | 12/1990 | Auvinen et al. | 365/189.09 |
| 5,043,945 | 8/1991 | Bader | 365/190 |
| 5,047,984 | 9/1991 | Monden | 365/203 |
| 5,047,985 | 9/1991 | Miyaji | 365/203 |
| 5,058,067 | 10/1991 | Kertis | 365/190 |
| 5,075,891 | 12/1991 | Yano | 365/190 |
| 5,091,889 | 2/1992 | Hamano | 365/233.5 |

OTHER PUBLICATIONS

IBM Technical Disclosure Bulletin, vol. 29, No. 5, Oct. 1986, "Dense Sense Amplifier/Latch Combination", pp. 2160-2161.

Primary Examiner—Joseph A. Popek
Attorney, Agent, or Firm—Skjerven, Morrill, MacPherson, Franklin & Friel

[57] ABSTRACT

An amplifier of the present invention is suitable for use as sense amplifier in memories. Some embodiments of the amplifier are simple, fast and consume little power. A memory using the amplifier is also provided.

16 Claims, 5 Drawing Sheets

TRACK-AND-REGENERATE AMPLIFIERS AND MEMORIES USING SUCH AMPLIFIERS

CROSS-REFERENCE TO RELATED APPLICATIONS

This application is related to, and incorporates by reference, U.S. patent application Ser. No. 07/709,024, entitled "Static Memories and Methods of Reading Static Memories" filed by M. A. Ang and D. F. Pilling on May 30, 1991.

BACKGROUND OF THE INVENTION

The present invention relates to electric devices, and more particularly to amplifiers.

FIG. 1 is a circuit diagram of one column of an array of four-transistor memory cells in a static random access memory. For simplicity, only one memory cell 110 is shown. Four-transistor memory cells are described, for example, in the aforementioned application Ser. No. 07/709,924 entitled "Static Memories and Methods of Reading Static Memories". In one example, voltage VCC is 5.0 V and voltage VSS is 0.0 V.

Bit lines BL and $\overline{BL}$ are biased statically near 2.5 V. When memory cell 110 is read, the row-address decoder ("X-decoder", not shown) drives a word line WL high. Pass transistors 130 and 134 turn on. Depending on the state of memory cell 110, one of bit lines BL and $\overline{BL}$ is pulled up and the other one is pulled down. The column decoder ("Y-decoder", not shown) drives line 140 high (5.0 V), turning on NMOS transistors 142 and 144. A high bandwidth, low gain pre-amplifier 150 amplifies the differential voltage on bit lines BL and $\overline{BL}$. The output of pre-amplifier 150 is connected to an input 154 of a sense amplifier 160. Sense amplifier 160 provides a CMOS level signal on its output 170.

FIG. 2 shows a circuit diagram of sense amplifier 160. PMOS transistors 210 and 212 and NMOS transistors 214, 216, 218 and 220 are connected as in a six-transistor memory cell. Six-transistor memory cells are described generally in C. A. Holt, *Electronic Circuits* (John Wiley & Sons, 1978), pages 293, 294. During a tracking stage, signal SENSE is low, and accordingly $\overline{SENSE}$ is high. Transistors 218 and 220 are on. Node 230 tracks the voltage on input 154 and thus charges to a value either above or below 2.5 V. A terminal 236 is biased statically at 2.5 V, so node 240 charges to 2.5 V. Transistors 250 and 252 are off isolating voltages VCC and VSS from nodes 230 and 240. If voltages VCC and VSS were made available to nodes 230 and 240, the regenerative effect would force nodes 230 and 240 to a stable state driving one node to 5.0 V and the other node to 0.0 V, and the input signal 154 would be unable to overcome the stable state.

Then signal SENSE becomes high. Transistors 218 and 220 turn off, and transistors 250 and 252 turn on. If node 230 is below 2.5 V, then it is pulled down to 0.0 V, node 240 is pulled up to 5.0 V, and NAND gate 270 provides 0.0 V on output 170. Conversely, if node 230 is above 2.5 V, gate 270 provides 5.0 V on output 170.

NAND gates 270 and 272 are provided to avoid oscillation on output 170 and a complementary output 274 during the tracking stage when nodes 230 and 240 are near 2.5 V.

It is desirable to provide a simpler sense amplifier that uses less power.

SUMMARY OF THE INVENTION

An amplifier of the present invention has two pairs of cross-coupled transistors. In some embodiments, just as in prior art, one pair contains PMOS transistors and the other pair contains NMOS transistors. However, contrary to the prior art, the sources of PMOS transistors are always connected to VCC. No separate transistor isolating VCC from the nodes at the drains of the PMOS transistors is used, so the circuit is simpler. A precharge circuitry is provided that precharges the two nodes to VCC before the tracking stage and thus turns off the PMOS transistors at least at the beginning of the tracking stage. One node is eventually pulled low turning on the PMOS transistor whose drain is connected to the other, high node. That transistor reinforces the high node and the high bit line connected to the node, restoring any leaking charge on the bit line. Thus the memory can operate even at low frequencies when the bit line charge leakage is significant.

The amplifier is particularly suitable for memories in which the bit lines are biased at VCC during a read. Such memories are described in the aforementioned application No. 07/709,924 entitled "Static and Methods of Reading Static Memories".

In some embodiments, the precharge circuitry contains, in addition to transistors charging the two nodes to VCC, an equalizing transistor that shorts, during precharge, the two nodes at the drains of the PMOS transistors and, consequently, the gates of the PMOS transistors. As a result, the node with the lowest voltage is pulled up faster, and further an additional precharge of the nodes is provided by the PMOS transistors themselves. The precharge operations is thus very fast.

The power consumption is reduced because the amplifier does not need a bias generator.

The amplifier is fast also because the two nodes are precharged to VCC, so during tracking the proper differential voltage on the nodes is developed simply by pulling one of the nodes down by a small value (0.3 V in some embodiments). By contrast, in the prior art, no precharge is used, so the sense amplifier input node must be charged during tracking from its CMOS level of 0.0 V or 5.0 V attained during a previous read. If the memory output is being switched, the input node voltage must change by at least 2.5 V. Thus in the present invention, the tracking is faster. The precharge is also fast, and further the precharge overlaps with address decoding in some embodiments. The amplifier is thus very fast.

Since the two nodes are at a CMOS level during tracking, no gates are needed to avoid oscillation on the sense amplifier outputs.

A memory using the amplifier is also provided.

DESCRIPTION OF THE PREFERRED EMBODIMENTS

Figure 1:
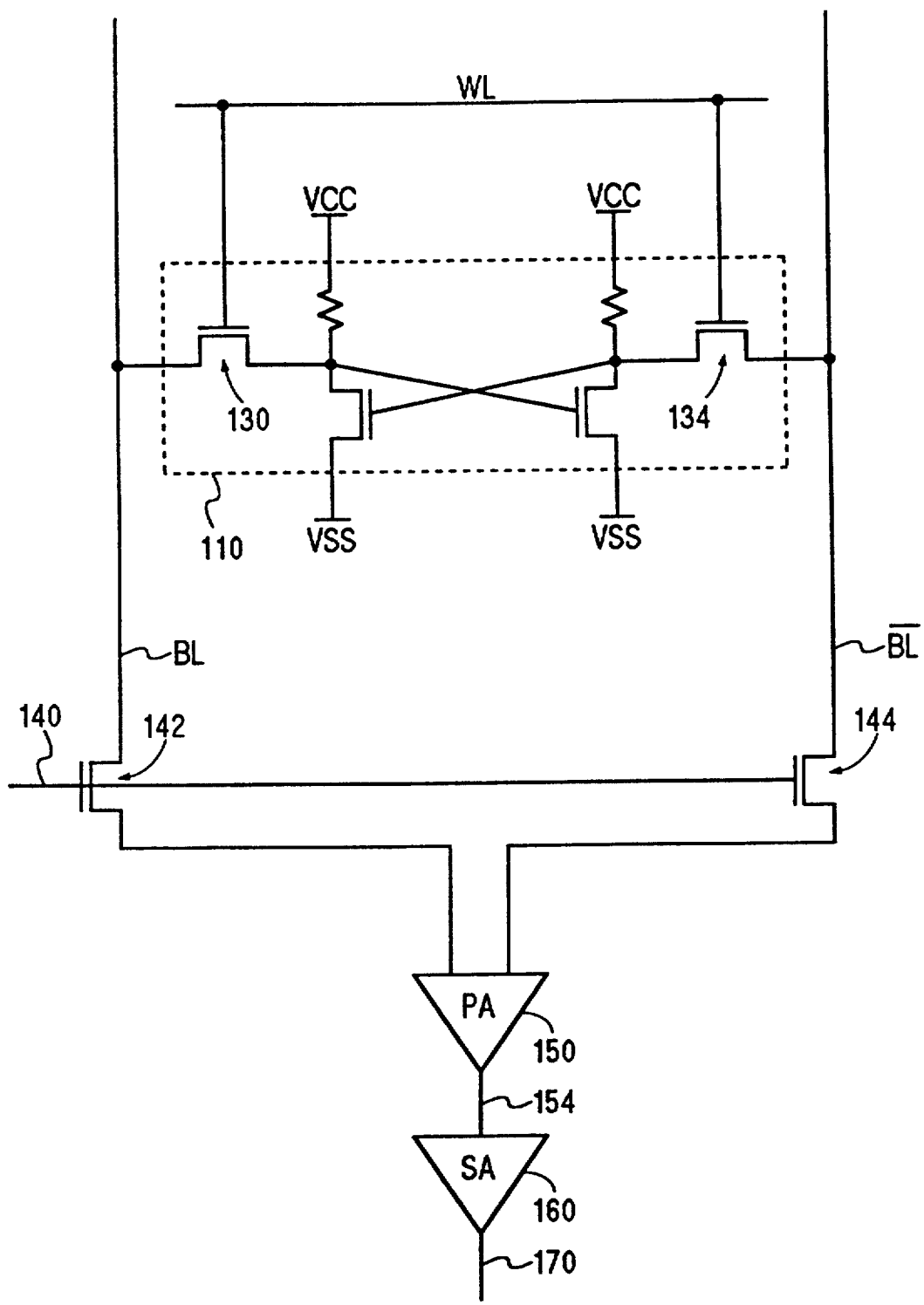
FIG. 1 is a circuit diagram of a portion of a prior art static random access memory.
Figure 2:
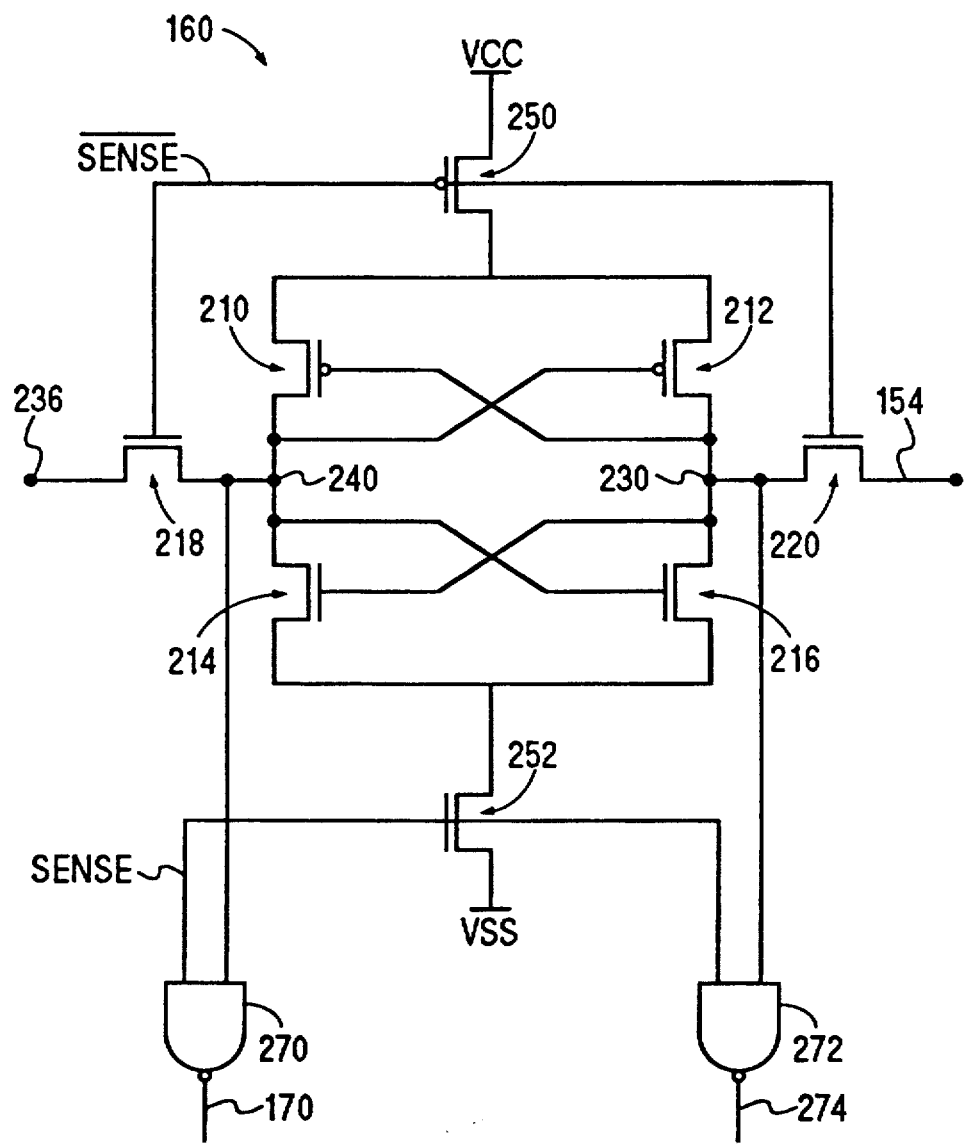
FIG. 2 is a circuit diagram of a prior art sense amplifier.
Figure 3:
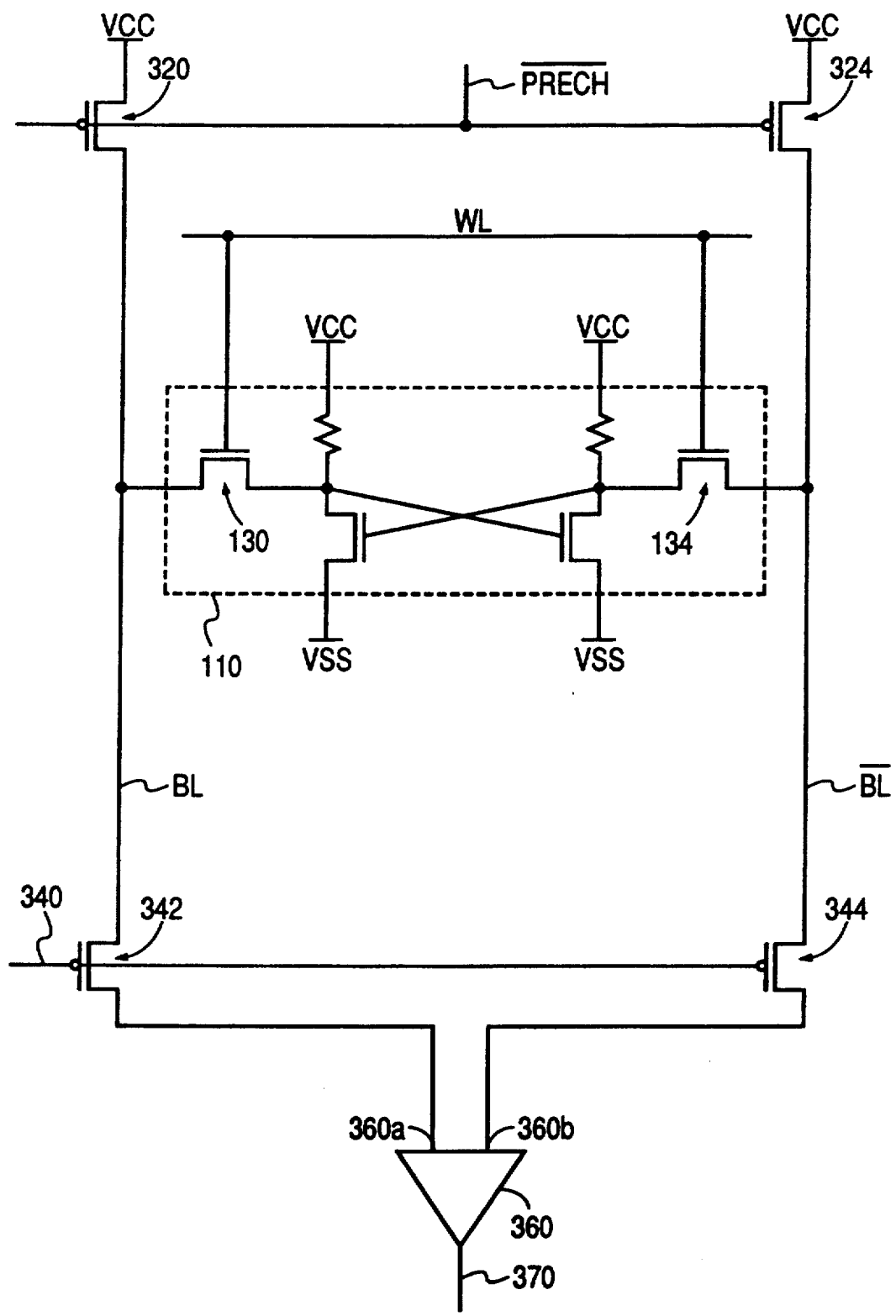
FIG. 3 is a circuit diagram of a portion of a memory of the present invention.

FIG. 3 shows a circuit diagram of a portion of a static memory. The memory is powered by power supply voltage VCC (for example, 5.0 V). Reference voltage VSS is 0.0 V in some embodiments. During read, bit lines BL and $\overline{BL}$ are biased at or near VCC. The memory and its operation are described in detail in the aforementioned U.S. patent application Ser. No. 07/709,924 filed May 30, 1991 entitled "Static Memories and Methods of Reading Static Memories" whose disclosure is incorporated by reference herein.

Briefly, the reading operation occurs as follows. Signal $\overline{PRECH}$ is asserted low turning on PMOS transistors 320 and 324. Bit lines BL and $\overline{BL}$ are precharged to VCC. Then $\overline{PRECH}$ becomes high. Word line WL is driven high, and pass transistors 130 and 134 turn on. Depending on the state of memory cell 110, the voltage on bit line BL or $\overline{BL}$ goes down. The column decoder ("Y-decoder", not shown) drives line 340 low. Y-decode PMOS transistors 342 and 344 turn on thus connecting respective bit lines BL and $\overline{BL}$ to respective inputs 360a and 360b of a sense amplifier 360. Sense amplifier 360 provides the amplified signal on an output 370. No pre-amplifier is used. Sense amplifier 360 is suitable for amplifying a differential signal on its inputs 360a and 360b that has a common mode voltage of about VCC.

Figure 4:
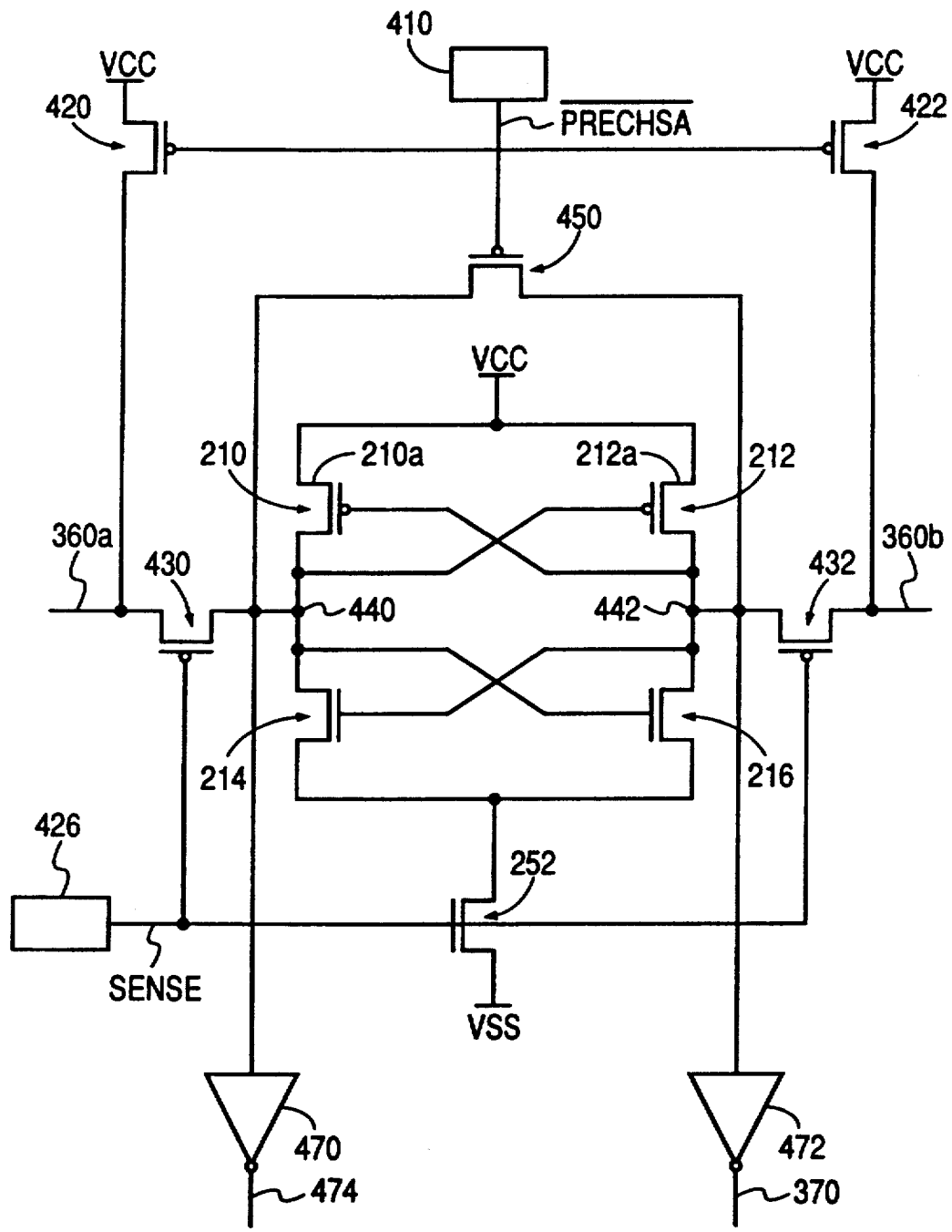
FIG. 4 is a circuit diagram of a sense amplifier of the present invention.

FIG. 4 shows a circuit diagram of one embodiment of sense amplifier 360. Sources 210a and 212a of respective PMOS transistors 210 and 212 are connected directly to VCC. A circuitry 410 built from conventional logic generates a signal $\overline{PRECH}$. Signal $\overline{PRECH}$ is the same as signal $\overline{PRECH}$ of FIG. 3 in some embodiments. In other embodiments, $\overline{PRECH}$ and $\overline{PRECH}$ are different signals. At the start of a reading cycle, signal $\overline{PRECH}$ is driven low starting a precharge stage which is shown as 412 in FIG. 5. PMOS transistors 420 and 422 turn on. Signal SENSE generated by a circuitry 426 built from conventional logic is also low. PMOS transistors 430 and 432 are therefore on. A node 440 precharges to VCC through transistors 420 and 430. A node 442 precharges to VCC through transistors 422 and 432.

Low signal $\overline{PRECHSA}$ turns on an equalizing PMOS transistor 450 shorting nodes 440 and 442 to each other. Consequently, nodes 440 and 442 are charged also through respective transistors 210 and 212 to voltage VCC−|VTP| wherein VTP is the threshold voltage of transistors 210 and 212 (−0.7 V in one embodiment in which VCC=5.0 V and VSS=0.0 V). The additional precharge through transistors 210 and 212 makes the precharging operation fast. Further, equalizing transistor 450 helps minimize input offset error.

After the precharge, signal $\overline{PRECHSA}$ becomes high, and tracking stage 454 begins. See FIG. 5. Nodes 440 and 442 track the voltages on respective bit lines BL and $\overline{BL}$ through respective transistors 430 and 432. Since bit lines BL and $\overline{BL}$ are biased at VCC, no additional device is needed to isolate VCC from nodes 440 and 442. The tracking operation is illustrated by the following example. Suppose that node 440 is pulled down during tracking as bit line BL is being pulled down by a memory cell. Node 442 is at VCC, so transistor 210 is off. If the tracking time is short, node 440 never goes below VCC−|VTP| during tracking, thus keeping transistor 212 off. If the tracking time is long enough to allow node 440 to go below VCC−|VTP|, transistor 212 turns on reinforcing the high state of node 442 (restoring the leaking charge, if any, on node 442 and bit line $\overline{BL}$). The high state of node 442 reinforces the OFF state of transistor 210 allowing node 440 to be pulled down.

Since signal SENSE is low, NMOS transistor 252 is off isolating nodes 440 and 442 from VSS.

Figure 5:
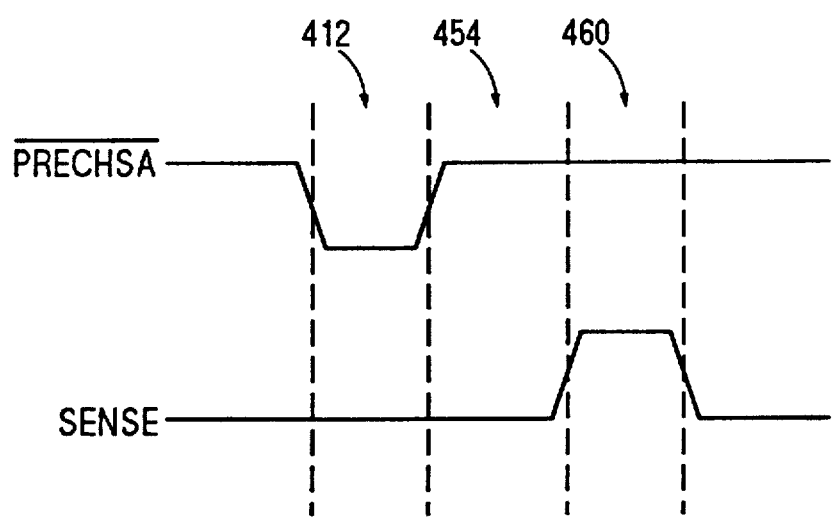
FIG. 5 shows timing diagrams of some signals in the sense amplifier of FIG. 4.

Then signal SENSE becomes high, and sensing stage 460 begins (FIG. 5). Transistor 252 turns on. Transistors 430 and 432 turn off. The regenerative effect pulls the lower of nodes 440 and 442 down to VSS. Inverters 470 and 472 invert the signals on respective nodes 440 and 442 providing complimentary output signals on respective outputs 474 and 370.

The simplicity of sense amplifier 360 is due in part to biasing bit lines BL and $\overline{BL}$ at or near VCC during memory reads. As explained above, no separate device is needed to isolate voltage supply VCC from nodes 440 and 442. Further, since VCC is directly connected to sources 210a and 212a, transistors 210 and 212 help precharge nodes 440 and 442 during precharge stage 412. Inverters 470 and 472 can replace more complex gates to provide stable output signals on respective outputs 474 and 370 because, during tracking stage 454, nodes 440 and 442 are near VCC which is a valid CMOS level.

The precharge during precharged stage 412 is fast. The source and drain of transistor 450 are connected directly to nodes 440 and 442. Hence, transistor 450 provides efficient equalization pulling up the lower of nodes 440 and 442 via charge sharing. At the same time, nodes 440 and 442 are pulled up to VCC−|VTP| through transistors 210 and 212 as explained above. These mechanisms combine with precharge through transistors 420 and 430 and through transistors 422 and 432 to provide fast precharge of nodes 440 and 442.

As explained above, if the tracking time is long, transistor 210 or 212 turns on restoring the leaking charge, if any, on the respective bit line. Consequently, the memory can be operated at very low frequencies, even when the charge leakage reaches significant levels. A low frequency operation of the memory is desirable, for example, during memory testing.

Sense amplifier 360 does not utilize a bias voltage. Power is saved because bias generation is not needed.

While the invention has been described with respect to the embodiments set forth above, other embodiments and variations not described herein are within the scope of the invention. For example, the invention is not limited by any specific values of VSS and VCC. Further, in some embodiments, bit lines BL and $\overline{BL}$ are biased below VCC. For example, in one embodiment, bit lines BL and $\overline{BL}$ are biased at 4.9 V while VCC=5.0 V and VSS=0.0 V. In that embodiment, the threshold voltages of transistors 210 and 212 are such that transistors 210 and 212 are off during at least the beginning of the tracking stage.

The sense amplifier of FIG. 4 is used with other memories than the memory shown in FIG. 3. Further, the sense amplifier of FIG. 4 is used as a differential amplifier to amplify non-memory signals. Other embodiments and variations not described herein are within the scope of the invention, as defined by the following claims.

What is claimed is:

1. A track-and-regenerate amplifiers having a tracking stage and a sensing stage that follows said tracking stage, said amplifier comprising:
   a first input terminal;

a second input terminal;
a first node;
first means for connecting said first node to said first input terminal;
a second node;
second means for connecting said second node to said second input terminal;
a first transistor having a current carrying electrode D1 connected to said first node and having a current carrying electrode S1 and a control electrode G1;
a second transistor having a current carrying electrode D2 connected to said second node and having a current carrying electrode S2 and a control electrode G2;
means for connecting said first node to said control electrode G2;
means for connecting said second node to said control electrode G1;
means for connecting said electrodes S1 and S2 to a first voltage so as to provide said first voltage on said electrodes S1 and S2 during said tracking and sensing stages;
means for controllably connecting said first and second nodes to a second voltage, one of said first and second voltages being a power supply voltage and the other one of said first and second voltages being a reference voltage;
an output terminal;
means for connecting said first node to said output terminal; and
means for precharging said first and second nodes to a predetermined voltage during a precharge stage before said tracking stage, said means for precharging comprising:
a third transistor having a current carrying electrode electrically connected to said first node, having another current carrying electrode electrically connected to said second node, and having a control electrode;
means connected to said control electrode of said third transistor for turning on said third transistor during said precharge stage and for turning off said third transistor during said tracking and sensing stages;
a fourth transistor having a current carrying electrode connected to said first node, another current carrying electrode connected to a source of power, and a control electrode;
a fifth transistor having a current carrying electrode connected to said second node, another current carrying electrode connected to a source of power, and a control electrode; and
means connected to said control electrodes of said fourth and fifth transistors for turning on said fourth and fifth transistors during said precharge stage and for turning off said fourth and fifth transistors during said tracking stage.

2. The amplifier of claim 1 wherein:
said first voltage is higher then said second voltage; and
said first and second transistors are PMOS transistors.

3. The amplifier of claim 1 wherein:
said first voltage is a power supply voltage; and
said second voltage is a reference voltage.

4. The amplifier of claim 3 wherein said reference voltage is 0.0 V.

5. The amplifier of claim 4 wherein said power supply voltage is 5.0 V.

6. The amplifier of claim 1 further comprising:
a voltage source supplying said first voltage; and
a voltage source supplying said second voltage.

7. The amplifier of claim 1 wherein said third transistor equalizes the voltages on said first and second nodes before said tracking stage of said amplifier.

8. The amplifier of claim 1 wherein said precharging means shorts said electrodes D1, G1, D2, and G2 to each other during said precharge stage.

9. The amplifier of claim 1 wherein said predetermined voltage on said first and second nodes turns off said first and second transistors when said electrodes S1 and S2 are at said first voltage.

10. The amplifier of claim 9 wherein said predetermined voltage is about equal to said first voltage.

11. The amplifier of claim 10 wherein:
said first voltage is 5.0 V;
said second voltage is 0.0 V; and
said predetermined voltage is at least 4.3 V; and
each of said first and second transistors is a PMOS transistor having a threshold voltage between $-0.7$ V and $-1.0$ V.

12. A memory comprising a sense amplifier having the structure of the differential amplifier of claim 9, said memory further comprising:
means for connecting said memory to said power supply voltage;
means for connecting said memory to said reference voltage;
a plurality of memory cells;
two bit lines BL and $\overline{BL}$ for providing the state of one or more of said memory cells;
means for connecting said bit line BL to the first input terminal of said sense amplifier; and
means for connecting said bit line $\overline{BL}$ to the second input terminal of said sense amplifier,
wherein said first means electrically connects said first input terminal to said first node during a tracking stage of said sense amplifier;
wherein said second means electrically connects said second input terminal to said second node during said tracking stage; and
wherein the voltage on at least one of said bit lines BL and $\overline{BL}$ is sufficient to keep one of said first and second PMOS transistors off during said tracking stage.

13. The amplifier of claim 1 further comprising means for turning off said first and second transistors during at least a beginning of said tracking stage.

14. The amplifier of claim 1 wherein said means for connecting said output terminal to said first node comprises an inverter having an input connected to said first node and having an output connected to said output terminal.

15. A track-and-regenerate differential amplifier comprising:
a first input terminal;
a second input terminal;
a first node;
first means for connecting said first node to said first input terminal;
a second node;
second means for connecting said second node to said second input terminal;

a first PMOS transistor having a source, a drain connected to said first node and a gate connected to said second node;

a second PMOS transistor having a source, a drain connected to said second node and a gate connected to said first node;

a first NMOS transistor having a source, a drain connected to said first node and a gate connected to said second node;

a second NMOS transistor having a source, a drain connected to said second node and a gate connected to said first node;

means for connecting the sources of said first and second NMOS transistors to a reference voltage VSS;

a first output terminal;

means for connecting said first node to said first output terminal;

means for providing a power supply voltage VCC to the sources of said first and second PMOS transistors continually during operation of said amplifier, wherein said power supply voltage VCC is higher than said reference voltage VSS: and means for precharging said first and second nodes to a predetermined voltage before a tracking stage of said amplifier, said predetermined voltage being at least VCC−|VTP|, wherein |VTP| is the maximum of the absolute values of the threshold voltages of said first and second PMOS transistors.

16. The amplifier of claim 15 further comprising:

a first transistor having a current carrying electrode connected directly to said first node, a current carrying electrode connected directly to said second node, and a control electrode; and means connected to the control electrode of said first transistor for turning on said first transistor when said first and second nodes are being precharged.

* * * * *

UNITED STATES PATENT AND TRADEMARK OFFICE
CERTIFICATE OF CORRECTION

PATENT NO. : 5,228,106
DATED : July 13, 1993
INVENTOR(S) : Michael A. Ang and David J. Pilling It is certified that error appears in the above-identified patent and that said Letters Patent is hereby corrected as shown below:

Col. 3, line 34, replace both occurrences of "$\overline{PRECH}$" with --$\overline{PRECHSA}$--;

Col. 3, line 36, delete "$\overline{PRECH}$" (second occurrence) and insert --$\overline{PRECHSA}$--;

Col. 3, line 37, delete "$\overline{PRECH}$" and insert --$\overline{PRECHSA}$--;

Col. 4, line 65, (Claim 1) delete "amplifiers" and insert --amplifier--.

Signed and Sealed this

Fourteenth Day of March, 1995

Attest:

*Attesting Officer*

BRUCE LEHMAN
*Commissioner of Patents and Trademarks*